US011476858B2

(12) United States Patent
Martens et al.

(10) Patent No.: US 11,476,858 B2
(45) Date of Patent: Oct. 18, 2022

(54) ADVANCED SUCCESSIVE APPROXIMATION REGISTER ANALOG-TO-DIGITAL CONVERTER AND CORRESPONDING METHOD

(71) Applicant: Imec vzw, Leuven (BE)

(72) Inventors: Ewout Martens, Heverlee (BE); Davide Dermit, Leuven (BE); Jan Craninckx, Boutersem (BE)

(73) Assignee: Imec vzw, Leuven (BE)

( * ) Notice: Subject to any disclaimer, the term of this patent is extended or adjusted under 35 U.S.C. 154(b) by 0 days.

(21) Appl. No.: 17/221,166

(22) Filed: Apr. 2, 2021

(65) Prior Publication Data
US 2021/0344349 A1 Nov. 4, 2021

(30) Foreign Application Priority Data

Apr. 29, 2020 (EP) .................................. 20172006

(51) Int. Cl.
*H03M 1/06* (2006.01)
*H03M 1/10* (2006.01)
*H03M 1/46* (2006.01)

(52) U.S. Cl.
CPC ....... *H03M 1/0607* (2013.01); *H03M 1/1061* (2013.01); *H03M 1/46* (2013.01)

(58) Field of Classification Search
CPC ..... H03M 1/0607; H03M 1/46; H03M 1/1061
See application file for complete search history.

(56) References Cited

U.S. PATENT DOCUMENTS

| | | | |
|---|---|---|---|
| 4,399,426 A | 8/1983 | Tan | |
| 8,587,466 B2* | 11/2013 | Debnath | H03M 1/145 341/163 |
| 8,854,240 B2* | 10/2014 | Chen | H03M 1/06 341/130 |
| 9,509,327 B2* | 11/2016 | Kibune | H03M 1/1009 |
| 2015/0288380 A1 | 10/2015 | Zhao et al. | |
| 2019/0131991 A1 | 5/2019 | Hsu | |

OTHER PUBLICATIONS

Extended European Search Report and Written Opinion, Application No. EP20172006.7, dated Oct. 28, 2020, 11 pages.
Mavrogordatos, Themistoklis G., Mustafa Kilic, and Yusuf Leblebici. "A hybrid CDAC-threshold configuring SAR ADC in 28nm FDSOI CMOS." In 2017 15th IEEE International New Circuits and Systems Conference (NEWCAS), pp. 213-216. IEEE, 2017.

(Continued)

*Primary Examiner* — Khai M Nguyen
(74) *Attorney, Agent, or Firm* — McDonnell Boehnen Hulbert & Berghoff LLP

(57) ABSTRACT

An successive approximation register analog-to-digital converter is provided. The successive approximation register analog-to-digital converter includes a digital-to-analog converter, a successive approximation register, a comparator, and a threshold voltage determining unit. In this context, the threshold voltage determining unit is configured to dynamically determine the threshold voltage of the comparator on the basis of the input signal of the digital-to-analog converter or the output signal of the comparator.

17 Claims, 6 Drawing Sheets

(56) References Cited

OTHER PUBLICATIONS

Yoshioka, Kentaro, Akira Shikata, Ryota Sekimoto, Tadahiro Kuroda, and Hiroki Ishikuro. "An 8b extremely area efficient threshold configuring SAR ADC with source voltage shifting technique." In 2014 19th Asia and South Pacific Design Automation Conference (ASP-DAC), pp. 31-32. IEEE, 2014.

Yoshioka, Kentaro, Akira Shikata, Ryota Sekimoto, Tadahiro Kuroda, and Hiroki Ishikuro. "An 8bit 0.35-0.8 V 0.5-30MS/s 2bit/step SAR ADC with wide range threshold configuring comparator." In 2012 Proceedings of the ESSCIRC (ESSCIRC), pp. 381-384. IEEE, 2012.

Chan, Ka Yan "Applying the "Split-ADC" Architecture to a 16 bit, 1 MS/s differential Successive Approximation Analog-to-Digital Converter." PhD diss., Worcester Polytechnic Institute, 2008.

Hershberg, Benjamin, Skyler Weaver, Seiji Takeuchi, Koichi Hamashita, and Un-Ku Moon. "Binary Access Memory: An optimized lookup table for successive approximation applications." In 2011 IEEE International Symposium of Circuits and Systems (ISCAS), pp. 1620-1623. IEEE, 2011.

\* cited by examiner

ADVANCED SUCCESSIVE APPROXIMATION REGISTER ANALOG-TO-DIGITAL CONVERTER AND CORRESPONDING METHOD

CROSS-REFERENCE TO RELATED APPLICATIONS

The present application is a non-provisional patent application claiming priority to European Patent Application No. 20172006.7, filed on Apr. 29, 2020, the contents of which are hereby incorporated by reference.

FIELD OF THE DISCLOSURE

The disclosure relates to an advanced successive approximation register analog-to-digital converter and a method for compensating a mismatch of a digital-to-analog converter of a successive approximation register analog-to-digital converter.

BACKGROUND

Generally, in times of an increasing number of applications employing a variety of electrical circuits, there is a growing need of an advanced successive approximation register analog-to-digital converter and a method for compensating a mismatch of a digital-to-analog converter of a successive approximation register analog-to-digital converter, which are exemplarily used for performing measurements with respect to such applications in order to verify their correct functioning in a particularly accurate and efficient manner.

US 2019/0131991 A1 shows an analog-to-digital converter including a controller, a comparator, and a switch capacitor array. The comparator has a first input terminal, a second input terminal, and an output terminal. The comparator is coupled to the controller. The switch capacitor array is coupled to the controller. The switch capacitor array includes a plurality of switch capacitor groups. The first input terminal of the comparator receives a first voltage quantity. The controller operates the switch capacitor groups, so as to provide a second voltage quantity to the second input terminal of the comparator by one of the switch capacitor groups and provide a compensation voltage quantity to the second input terminal of the comparator by at least another one of the switch capacitor groups. The comparator compares a voltage value received by the first input terminal and a voltage value received by the second input terminal, and provides a voltage comparison result to the controller. If the controller determines that a voltage quantity provided to the second input terminal approximates to a charge quantity provided to the first input terminal based on the voltage comparison result, the controller records a calibration charge quantity in a lookup table stored by the controller. The calibration voltage quantity is equal to the compensation voltage quantity minus or plus a voltage quantity provided by a unit capacitance.

As it can be seen, a compensation is exclusively performed with respect to the digital-to-analog converter being embodied in the form of the switch capacitor array, which in some examples leads to a limited accuracy and a reduced efficiency of the analog-to-digital converter comprising the digital-to-analog converter.

SUMMARY

Accordingly, examples include an advanced successive approximation register analog-to-digital converter and a method for compensating a mismatch of a digital-to-analog converter of a successive approximation register analog-to-digital converter, potentially providing high accuracy and efficiency.

According to a first aspect of the disclosure, an advanced successive approximation register analog-to-digital converter is provided. The advanced successive approximation register analog-to-digital converter comprises a digital-to-analog converter, a successive approximation register, a comparator, and a threshold voltage determining unit. In this context, the threshold voltage determining unit is configured to dynamically determine, especially to set, the threshold voltage of the comparator on the basis of the input signal of the digital-to-analog converter or the output signal of the comparator. In some examples, both a particularly high accuracy and a particularly high efficiency are provided.

In some examples, additionally or alternatively, the threshold voltage determining unit may be configured to dynamically determine, especially to set, the threshold voltage of the comparator on the basis of the output signals during the previous comparisons for the current sample.

According to a first example form of the first aspect of the disclosure, the advanced successive approximation register analog-to-digital converter further comprises a sample-and-hold unit. In this context, the sample-and-hold unit is configured to acquire the input signal of the advanced successive approximation register analog-to-digital converter. In some examples, the sample-and-hold unit may comprise, but is not limited to, a sampling switch connected to the top plate of the digital-to-analog converter of the analog-to-digital converter.

According to a second example form of the first aspect of the disclosure, the digital-to-analog converter is configured to provide an analog signal for the comparator on the basis of the output signal of the successive approximation register.

According to a further example form of the first aspect of the disclosure, the successive approximation register is configured to provide an approximate digital representation of the input signal of the advanced successive approximation register analog-to-digital converter for the digital-to-analog converter.

According to a further example form of the first aspect of the disclosure, the comparator is configured to compare the difference between the input signal of the advanced successive approximation register analog-to-digital converter and the output signal of the digital-to-analog converter with the threshold voltage of the comparator, and to provide the corresponding result of the comparison for the successive approximation register.

According to a further example form of the first aspect of the disclosure, the input signal of the comparator comprises or is a differential signal.

According to a further example form of the first aspect of the disclosure, the differential signal is symmetric with respect to a certain value, generally zero. In some examples, for example, complexity can further be reduced, thereby increasing both accuracy and efficiency.

According to a further example form of the first aspect of the disclosure, the dynamic determination of the threshold voltage of the comparator comprises or is an iterative determination. In some examples, for instance, accuracy can further be increased.

According to a further example form of the first aspect of the disclosure, for example, in a first iteration step, when the input signal is directly brought to the top plate of the digital-to-analog converter, the threshold voltage determining unit is configured to set the threshold voltage of the comparator to zero or the offset of the comparator especially caused by mismatch. For example, not only accuracy but also efficiency can further be increased.

According to a further example form of the first aspect of the disclosure, for example, in a second iteration step, the threshold voltage determining unit is configured to set, to increase or decrease, the threshold voltage of the comparator, with an amount, based on, the mismatch of, the most significant bit of the digital-to-analog converter. In some examples, both inaccuracies and inefficiencies can further be reduced.

According to a further example form of the first aspect of the disclosure, especially in a third iteration step, the threshold voltage determining unit is configured to set, generally to increase or decrease, the threshold voltage of the comparator, generally with an amount, based on, generally the mismatch of, one bit less than the most significant bit of the digital-to-analog converter. In some examples, for example, efficiency and accuracy can further be increased.

According to a further example form of the first aspect of the disclosure, in the case that further iteration steps are required, in each further step, the threshold voltage determining unit is configured to set, generally increase or decrease, the threshold voltage of the comparator, by an amount, based on, the mismatch of, the lowest bit of the previous step of the digital-to-analog converter. For instance, accuracy can be increased in a particularly efficient manner.

According to a second aspect of the disclosure, a method for compensating a mismatch of a digital-to-analog converter of a successive approximation register analog-to-digital converter is provided. The method comprises the step of dynamically determining the threshold voltage of a comparator of the successive approximation register analog-to-digital converter on the basis of the input signal of the digital-to-analog converter or the output signal of the comparator. In some examples, both a particularly high accuracy and a particularly high efficiency are provided.

According to a first example form of the second aspect of the disclosure, the dynamic determination of the threshold voltage of the comparator comprises or is an iterative determination. In some examples, for instance, accuracy can further be increased.

According to a second example form of the second aspect of the disclosure, the method further comprises the step of, for example as a first iteration step, setting the threshold voltage of the comparator to zero or to the offset of the comparator especially caused by mismatch.

In addition to this or as an alternative, the method further comprises the step of, especially as a second iteration step, setting, for example increasing or decreasing, the threshold voltage of the comparator, generally by an amount, based on, the mismatch of, the most significant bit of the digital-to-analog converter. In some examples, for instance, both inaccuracies and inefficiencies can further be reduced.

The method optionally comprises the step of, for example as a third iteration step, setting, for example increasing or decreasing, the threshold voltage of the comparator, by an amount, based on, the mismatch of, one bit less than the most significant bit of the digital-to-analog converter. In some examples, for example, efficiency and accuracy can further be increased.

In further addition to this or as a further alternative, the method further comprises the step of, for example in the case that further iteration steps are required, as each further step, setting, for example increasing or decreasing, the threshold voltage of the comparator, by an amount, based on, for example the mismatch of, the lowest bit of the previous step of the digital-to-analog converter. In some examples, for instance, accuracy can be increased in a particularly efficient manner.

BRIEF DESCRIPTION OF THE FIGURES

The above, as well as additional, features will be better understood through the following illustrative and non-limiting detailed description of example embodiments, with reference to the appended drawings.

Embodiments of the disclosure are now further explained with respect to the drawings by way of example only, and not for limitation.

All the figures are schematic, not necessarily to scale, and generally only show parts used to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
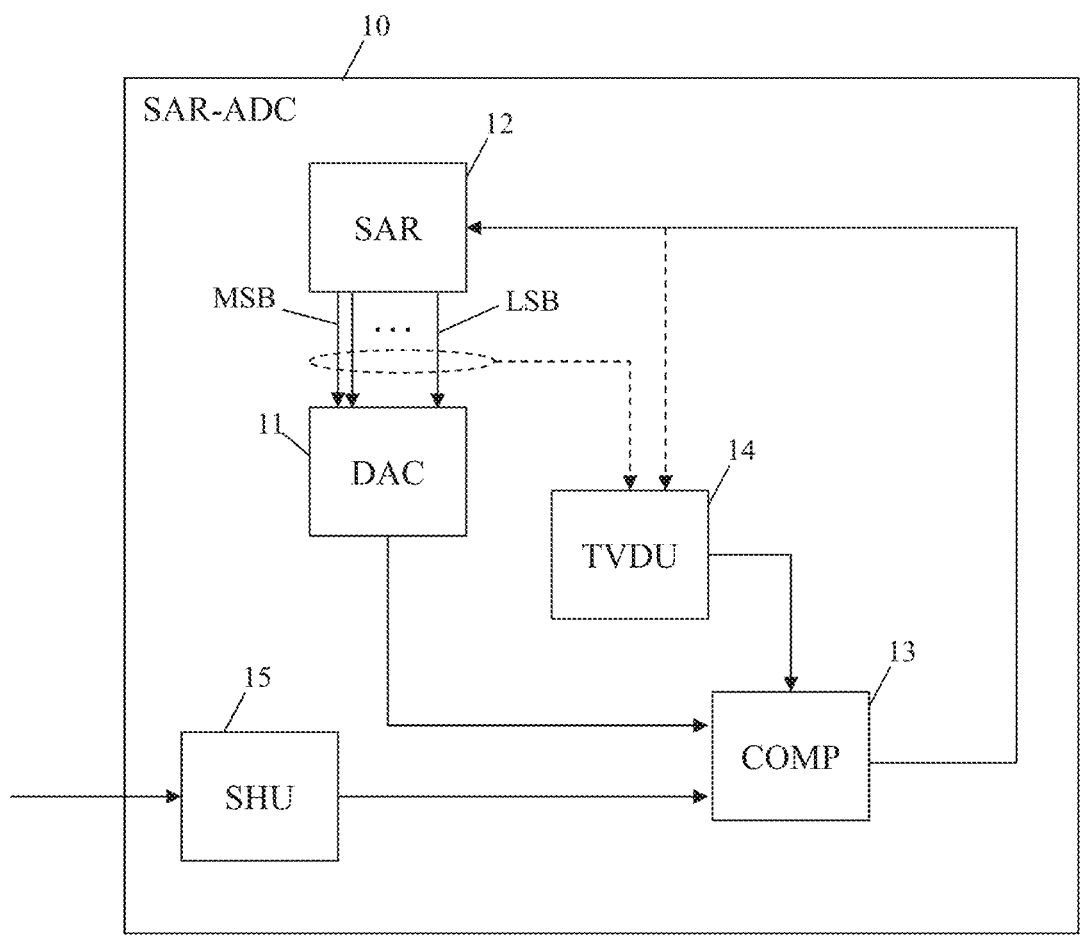
FIG. 1 shows a successive approximation register analog-to-digital converter, according to an example.

With respect to FIG. 1, a block diagram of an embodiment of an advanced successive approximation register analog-to-digital converter (SAR-ADC) 10 is shown.

According to FIG. 1, the SAR-ADC 10 comprises a digital-to-analog converter 11, a successive approximation register 12, a comparator 13, and a threshold voltage determining unit 14. In this context, the threshold voltage determining unit 14 is configured to dynamically determine the threshold voltage of the comparator 13 on the basis of the input signal of the digital-to-analog converter 11 or the output signal of the comparator 13.

In some embodiments, the threshold voltage determining unit 14 firstly determines the threshold voltage based on the output signal, such as the previous output signal of the comparator 13 and then increases or decreases the threshold voltage for the new comparison by an amount based on the mismatch of the digital-to-analog converter capacitors that are switched based on the output of the comparator 13.

As it can further be seen from FIG. 1, the SAR-ADC 10 further comprises a sample-and-hold unit 15. In this context, the sample-and-hold unit 15 is configured to acquire the input signal of the SAR-ADC 10.

In some embodiments, the digital-to-analog converter 11 is configured to provide an analog signal for the comparator 13 on the basis of the output signal of the successive approximation register 12. It is further noted that the successive approximation register 12 may be configured to provide an approximate digital representation of the input signal of the SAR-ADC 10 for the digital-to-analog converter 11.

Furthermore, the comparator 13 may be configured to compare the difference between the input signal of the SAR-ADC 10 and the output signal of the digital-to-analog converter 11 with the threshold voltage of the comparator 13, and to provide the corresponding result of the comparison for the successive approximation register 12. Moreover, in some embodiments, the input signal of the comparator 13 comprises or is a differential signal.

It is further noted that the dynamic determination of the threshold voltage of the comparator 13 may comprise or be an iterative determination. With respect to the iterative determination, for example in a first iteration step, the threshold voltage determining unit 14 may be configured to set the threshold voltage of the comparator 13 to zero or to an offset of the comparator 13.

In addition to this or as an alternative, for example in a second iteration step, the threshold voltage determining unit 14 may be configured to increase or decrease the threshold voltage of the comparator 13 by an amount based on switching the most significant bit with a mismatch of the digital-to-analog converter 11.

Further additionally or further alternatively, for example in a third iteration step, the threshold voltage determining unit 14 may be configured to increase or decrease the threshold voltage of the comparator 13 by an amount based on switching one bit less than the most significant bit with a mismatch of the digital-to-analog converter 11.

In further addition to this or as a further alternative, for example in the case that further iteration steps are performed, in each further step, the threshold voltage determining unit 14 may be configured to increase or decrease the threshold of comparator 13 by an amount based on switching one bit less than the lowest bit of the previous step with a mismatch of the digital-to-analog converter 11.

Figure 2:
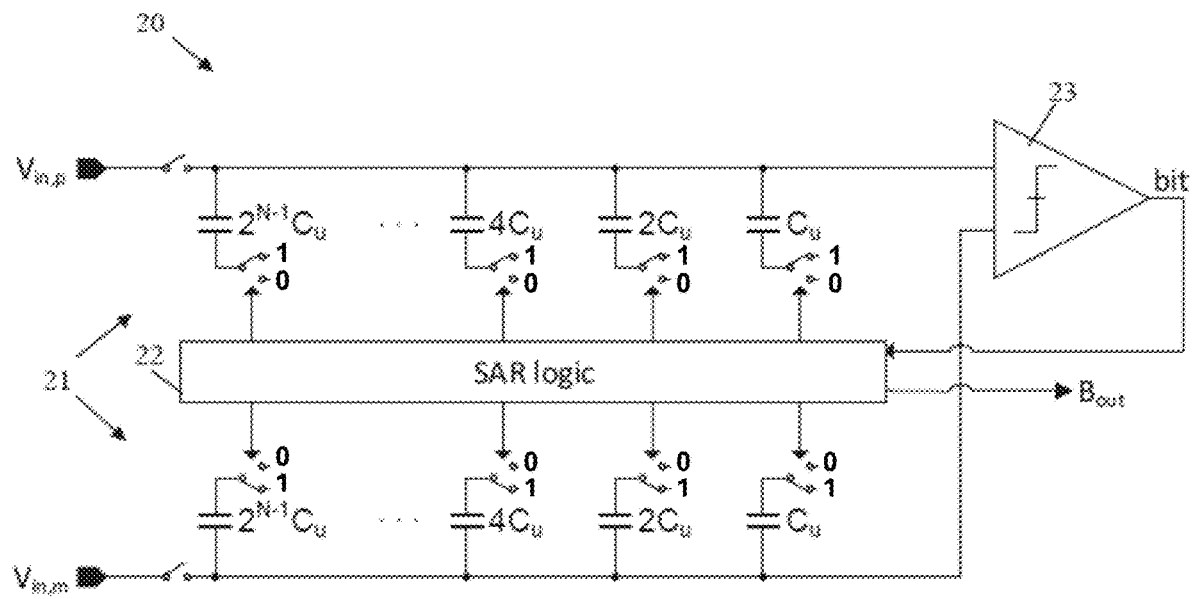
FIG. 2 shows a differential (N+1)-bit successive approximation register analog-to-digital converter without digital-to-analog converter mismatch compensation, according to an example.

Now, with respect to FIG. 2, a differential (N+1)-bit successive approximation register analog-to-digital converter (SAR-ADC) 20 is shown. In this context, the input signal is sampled onto a differential digital-to-analog converter 21 of the (N+1)-bit (SAR-ADC) 20, wherein a mismatch in the digital-to-analog converter 21 is not compensated. As it can further be seen, the (N+1)-bit (SAR-ADC) 20 additionally comprises a successive approximation register 22 and a comparator 23.

It is noted that each of the two differential paths of the digital-to-analog converter 21 comprises N capacitors. In this context, the capacitance value of the capacitor for the most significant bit (MSB) is $2^{N-1}$ times the capacitance value of the capacitor for the least significant bit (LSB), whereas the capacitance value is halved for each bit between the most and the least significant bit (starting from the MSB and going to the LSB).

In an example, for example due to mismatch effects during the fabrication of the device, these capacitance values may slightly differ from the designed values. Hence, the output voltage of the digital-to-analog converter may differ from the intended one, which may cause errors in the analog-to-digital conversion.

The mismatch in the digital-to-analog converter 21 is to be compensated especially with a signal-dependent offset in the comparator 23, which will be explained in more detail in the following. For the sake of completeness, it is primarily demonstrated what happens if the mismatch is not compensated with the aid of the threshold voltage determination or the signal-dependent offset.

In this context, after the sampling operation which puts a voltage $V_{sampled}$ on the top plate of the digital-to-analog converter, the comparator 23 (without offset) decides on the most significant bit according to the following equation:

$$MSB = b_{N-1} = \begin{cases} 0 & \text{if } V_{sampled} < 0, \\ 1 & \text{if } V_{sampled} > 0. \end{cases} \quad (1)$$

Figure 3:
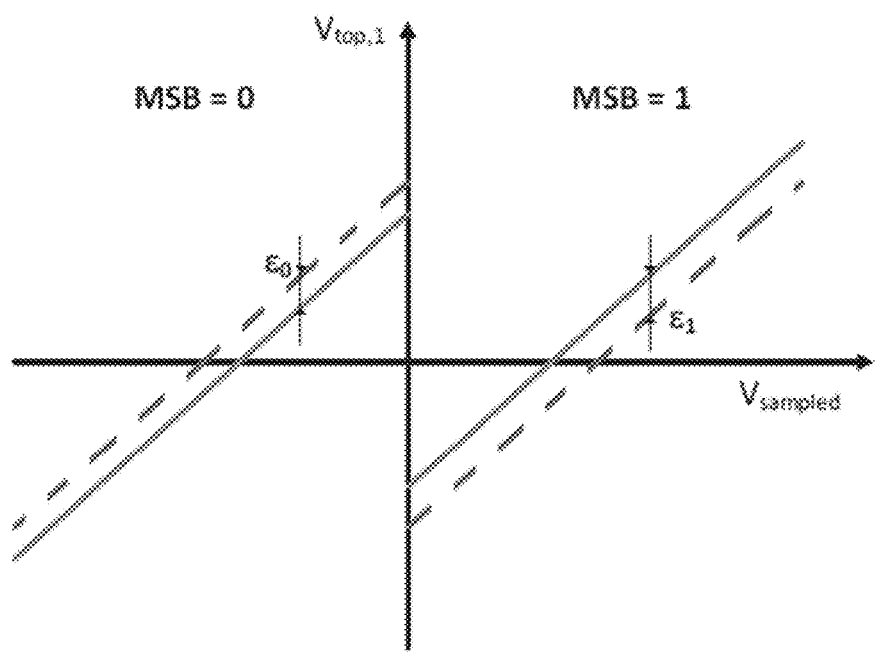
FIG. 3 shows top plate voltages of the digital-to-analog converter in an ideal case (dotted line) and with mismatch (solid line), according to an example.

Then, the digital-to-analog converter 21 generates a new signal on its top plate as illustrated by FIG. 3 showing top plate voltages of the digital-to-analog converter 21 for example versus the sampled input voltage $V_{sampled}$ in an ideal case (dotted line) and with mismatch (solid line).

As it can be seen from FIG. 3, with mismatch in the digital-to-analog converter 21, an error $\varepsilon_0$ or $\varepsilon_1$ is made depending on the value of $b_{N-1}$. The top plate voltage then becomes:

$$V_{top,1} = V_{sample} + (1-2b_{N-1}) \cdot \overline{V}_{fb,MSB} + \varepsilon(b_{N-1}) = \overline{V}_{top,1} + \varepsilon_{MSB}(b_{N-1}) \quad (2)$$

In this context, $\overline{V}_{fb,MSB}$ denotes the ideal MSB feedback step, $\overline{V}_{top,1}$ denotes the ideal top plate value, and $\varepsilon_{MSB}(b_{N-1})$ denotes the error due to the MSB switching with mismatch of the digital-to-analog converter 21:

$$\varepsilon_{MSB}(b_{N-1}) = \begin{cases} \varepsilon_0 & \text{if } b_{N-1} = 0, \\ \varepsilon_1 & \text{if } b_{N-1} = 1. \end{cases} \quad (3)$$

For an ideal converter, the next bit is determined by a comparator without offset:

$$b_{N-2} = \begin{cases} 0 & \text{if } \overline{V}_{top} < 0, \\ 1 & \text{if } \overline{V}_{top} > 0. \end{cases} \quad (4)$$

In the case of mismatch, this would cause errors in the analog-to-digital conversion, since the actual $V_{top}$ especially differs from the ideal $V_{top}$.

However, from equation (2) above, this comparison gives the same result as $$b_{N-2} = \begin{cases} 0 & \text{if } V_{top} < \varepsilon_{MSB}(b_{N-1}), \\ 1 & \text{if } V_{top} > \varepsilon_{MSB}(b_{N-1}). \end{cases} \quad (5)$$

So, if the comparator has a built-in offset of $\varepsilon_{MSB}(b_{N-1})$, the mismatch of the digital-to-analog converter 21 is compensated.

Figure 4:
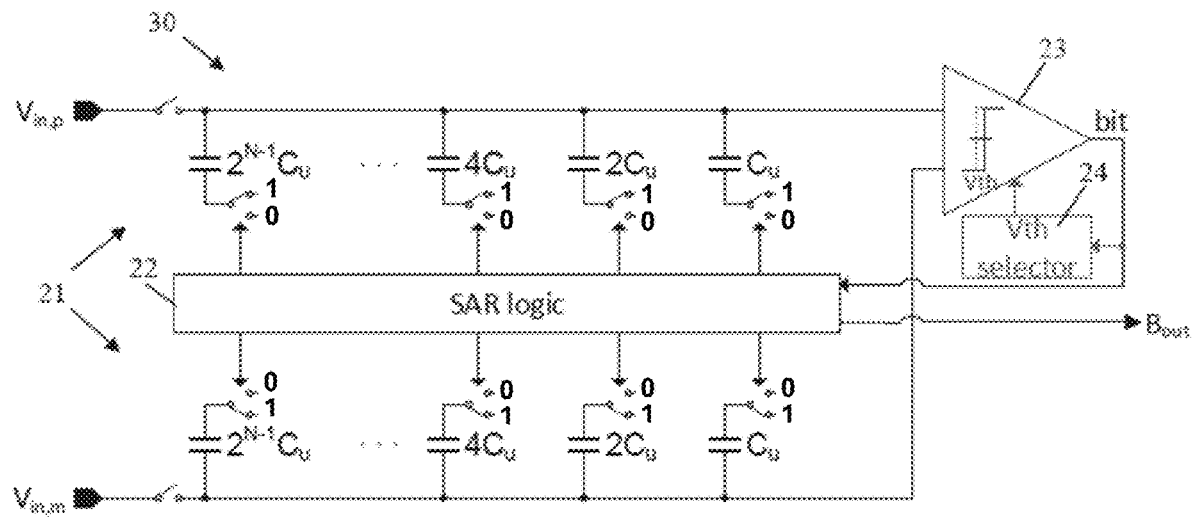
FIG. 4 shows the differential N-bit successive approximation register analog-to-digital converter of FIG. 2 with an additional signal-dependent comparator offset, according to an example.

This leads to the differential (N+1)-bit successive approximation register analog-to-digital converter 30 with an additional signal-dependent comparator offset according to the disclosure as shown in FIG. 4, which is based on FIG. 2. In this context, it is noted that FIG. 4 especially differs from FIG. 2 in that FIG. 4 additionally comprises a threshold voltage determining unit, namely the threshold voltage (Vth) selector 24.

Each time the digital-to-analog converter 21 executes a feedback, the new value on the top plate can be written as:

$$V_{top,k} = V_{top,k-1} + (1 - 2b_{N-k}) \cdot \overline{V}_{fb,MSB-k+1} + \varepsilon(b_{N-k}) \quad (6a)$$

$$= \overline{V}_{top,k} + \varepsilon_{MSB}(b_{N-1}) + \varepsilon_{MSB-1}(b_{N-2}) + \ldots + \varepsilon_{MSB-k+1}(b_{N-k}) \quad (6b)$$

Hence, to obtain the correct result from the comparators, the offset Vth (threshold voltage) should be set as:

step 0: $Vth = 0$ step 1: $Vth = \varepsilon_{MSB}(b_{N-1})$ step 2: $Vth = \varepsilon_{MSB}(b_{N-1}) + \varepsilon_{MSB-1}(b_{N-2})$

...

step k: $Vth = \varepsilon_{MSB}(b_{N-1}) + \varepsilon_{MSB-1}(b_{N-2}) + \ldots + \varepsilon_{MSB-k+1}(b_{N-k})$ The amounts by which the threshold determining unit should increase or decrease the threshold voltage or then as follows:

step 0: $\Delta Vth = 0$ step 1: $\Delta Vth = \varepsilon_{MSB}(b_{N-1})$ step 2: $\Delta Vth = \varepsilon_{MSB-1}(b_{N-2})$

...

step k: $\Delta Vth = \varepsilon_{MSB-k+1}(b_{N-k})$

Assuming the errors become smaller, when going deeper into the conversion, after some steps the threshold can be kept constant to continue the conversion.

In some embodiments, the offset of the comparator is added as follows:

step 0: $\Delta Vth = V_{offset}$ step 1: $\Delta Vth = \varepsilon_{MSB}(b_{N-1})$ step 2: $\Delta Vth = \varepsilon_{MSB-1}(b_{N-2})$

...

step k: $\Delta Vth = \varepsilon_{MSB-k+1}(b_{N-k})$

Figure 5A:
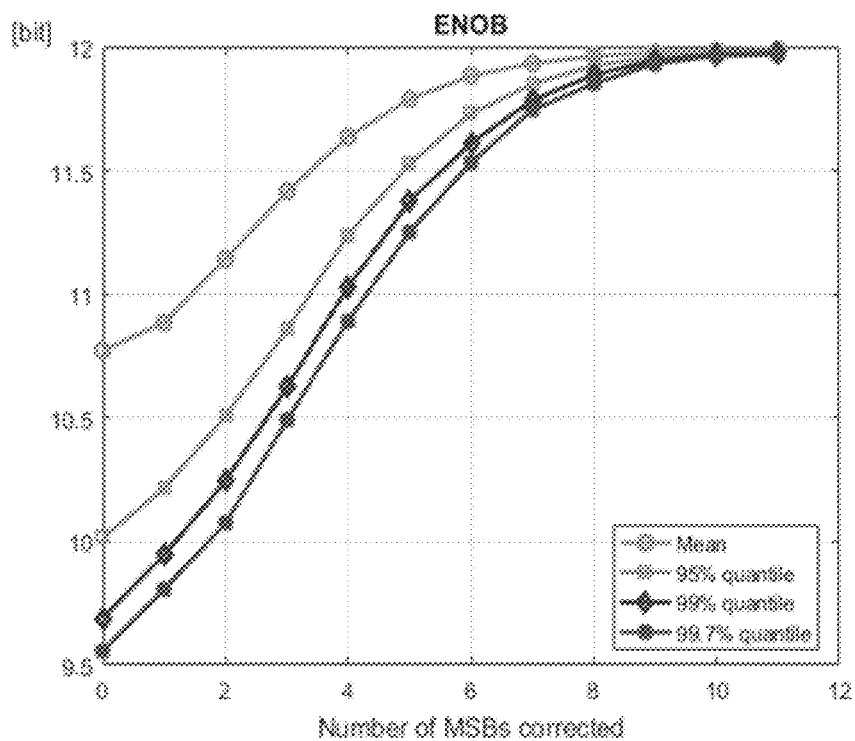
FIG. 5A shows an improvement of the effective number of bits, according to an example.
Figure 5B:
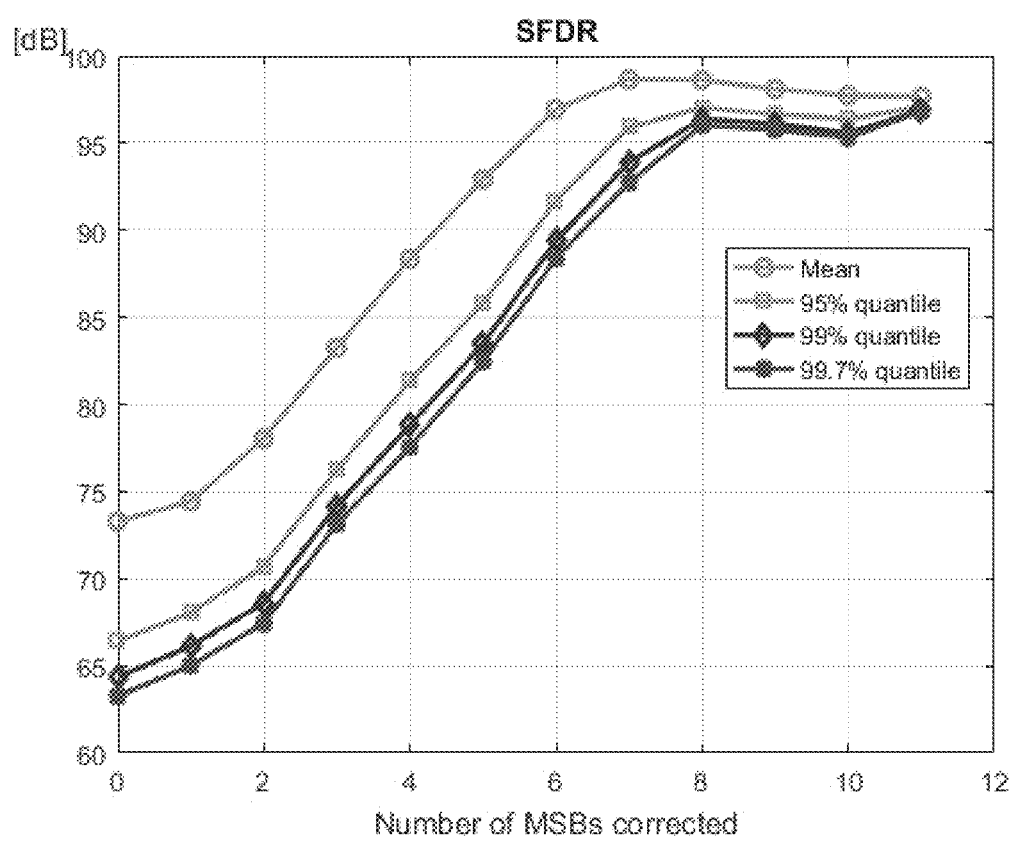
FIG. 5B shows an improvement of the spurious-free dynamic range, according to an example.

Furthermore, FIG. 5A and FIG. 5B show the effect on the effective number of bits (ENOB) and spurious-free dynamic range (SFDR) for a 12-bit SAR for 5000 Monte-Carlo points with random mismatch. The x-axis contains the number of comparisons with signal-dependent threshold. As described above, the remaining comparisons are done with the same threshold as the last one.

Figure 6:
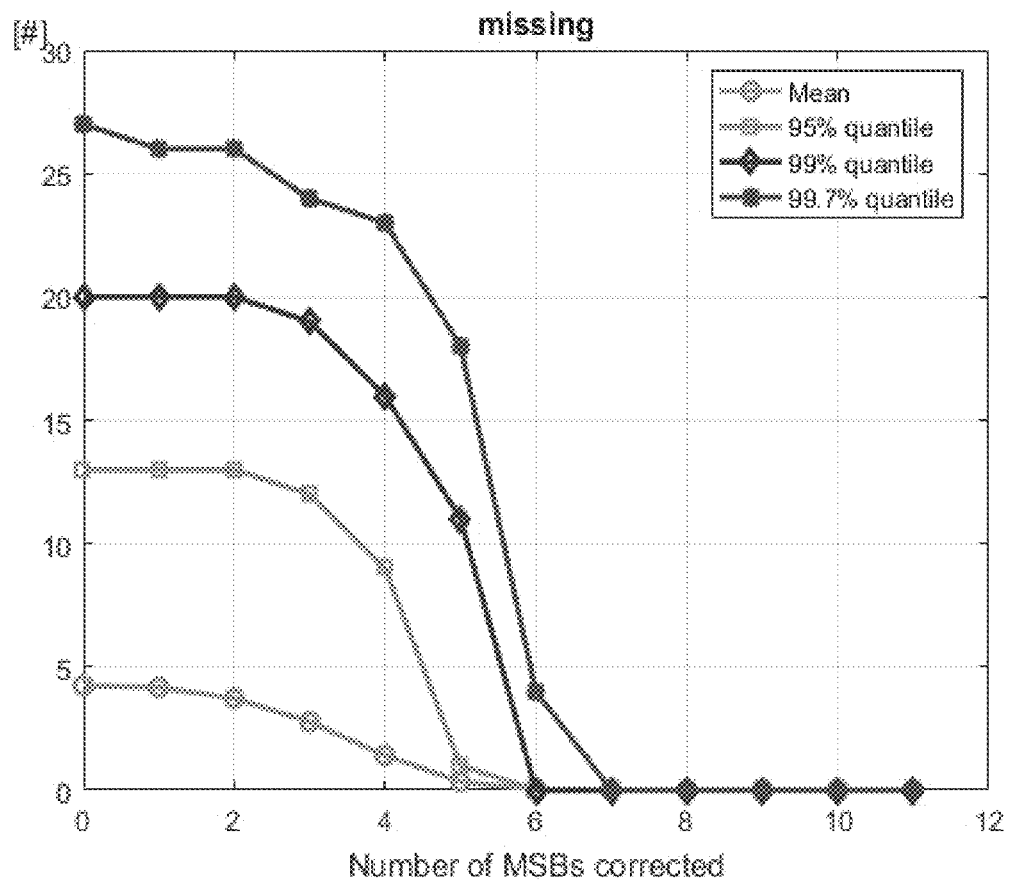
FIG. 6 shows a reduction of the number of missing codes, according to an example.

Moreover, in FIG. 6, the number of missing codes is plotted. With the aid of the systems and methods of the disclosure, the number of missing codes drops to zero after enabling the signal-dependent offset for enough comparisons.

It is further noted that the disclosure also provides the following potential benefits:

The size of the digital-to-analog converter 21 can be made much smaller than required by the matching. This saves digital-to-analog converter area as well as power drawn from the reference. Also, settling becomes faster due to smaller RC time constants.

Further In some examples, the successive approximation register analog-to-digital converter starts from a basic successive approximation register without changing the switching scheme or requiring oversampling.

In some embodiments, no digital post-processing is required. Accuracy is set by the resolution of the threshold voltage tuning especially in the analog domain, which generally requires less complexity to achieve the same level of accuracy.

In some examples, the offset of the comparator 23 is easily tuned within less than 1 LSB via, e.g., nonlinear capacitors made with metal oxide semiconductor capacitors (MOSCAPs). Tuning via the digital-to-analog converter 21 requires very small linear units. For instance, a 0.2 fF unit is needed on a 1 pF to generate 0.2 mV compensation with Vdd=1V. Whereas 0.2 fF can be complicated to make, 0.2 mV compensation on the offset is usually straightforward.

In some embodiments, nonlinear tuning of the threshold voltage can be used to linearize the digital-to-analog converter 21.

Figure 7:
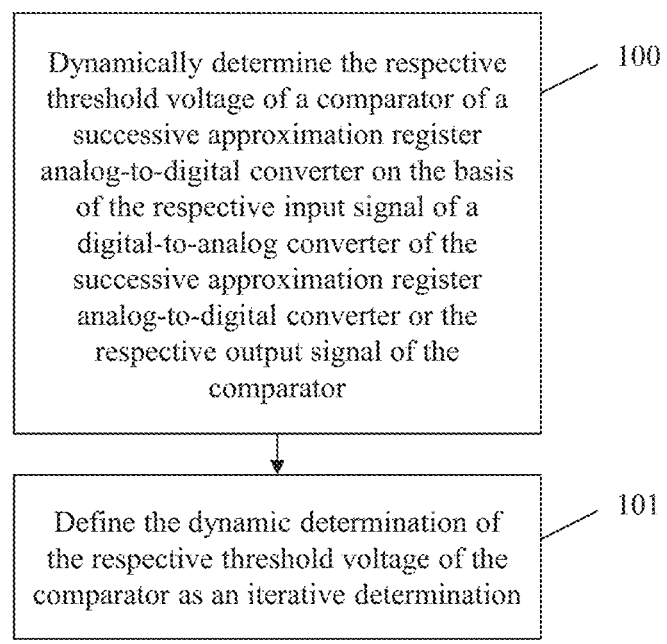
FIG. 7 shows a flow chart of a method for compensating a mismatch of a digital-to-analog converter of a successive approximation register analog-to-digital converter, according to an example.

Finally, FIG. 7 shows a flow chart of an embodiment of the method for compensating a mismatch of a digital-to-analog converter of a successive approximation register analog-to-digital converter (SAR-ADC).

In a first step 100, the threshold voltage of a comparator of the (SAR-ADC) is dynamically determined on the basis of the input signal of the digital-to-analog converter or the output signal of the comparator. Then, in a second step 101 being an optional step, the dynamic determination of the threshold voltage of the comparator is defined as an iterative determination.

In some embodiments, the method further comprises the steps of, for example as a first iteration step, setting the threshold voltage of the comparator to zero or to the offset of the comparator. In addition to this or as an alternative, for example as a second iteration step, the method may further comprise the step of increasing or decreasing the threshold voltage of the comparator by an amount based on switching the most significant bit with a mismatch of the digital-to-analog converter.

Further additionally or further alternatively, for example as a third iteration step, the method may further comprise the step of increasing or decreasing the threshold voltage of the comparator by an amount based on switching one bit less than the most significant bit with a mismatch of the digital-to-analog converter.

In further addition to this or as a further alternative, the method may further comprise the step of, for example in the case that further iteration steps are required, as each further step, increase or decrease the threshold by an amount based on switching one bit less than the lowest bit of the previous step with a mismatch of the digital-to-analog converter.

While various embodiments of the present disclosure have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

Although the disclosure has been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired for any given or particular application.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A successive approximation register analog-to-digital converter (SAR-ADC) comprising:
    a digital-to-analog converter (DAC);
    a successive approximation register (SAR);
    a comparator; and
    a threshold voltage determining unit (TVDU),
    wherein the TVDU is configured to set a threshold voltage of the comparator based on an input signal of the DAC or an output signal of the comparator, and
    wherein the TVDU is configured to set the threshold voltage of the comparator based on a mismatch of the DAC.

2. The SAR-ADC according to claim 1, further comprising a sample-and-hold unit configured to acquire an input signal of the SAR-ADC.

3. The SAR-ADC according to claim 2, wherein the sample-and-hold unit is configured to generate a differential signal as an output signal of the sample-and-hold unit.

4. The SAR-ADC according to claim 3, wherein the differential signal is symmetric.

5. The SAR-ADC according to claim 1, wherein the DAC is configured to provide an analog signal to the comparator based on the output signal of the SAR.

6. The SAR-ADC according to claim 1, wherein the SAR is configured to provide a digital representation of the input signal of the SAR-ADC to the DAC.

7. The SAR-ADC according to claim 1, wherein the comparator is configured to compare an input signal of the SAR-ADC and an output signal of the DAC with the threshold voltage of the comparator and to provide a result of the comparison to the SAR.

8. The SAR-ADC according to claim 1, wherein the TVDU is configured to determine the threshold voltage iteratively.

9. The SAR-ADC according to claim 1, wherein when the input signal of the DAC is configured to be directly brought to a top plate of the DAC, and the TVDU is configured to set the threshold voltage of the comparator to zero or to an offset of the comparator caused by mismatch.

10. The SAR-ADC according to claim 1, wherein the TVDU is configured to set the threshold voltage of the comparator based on a mismatch of a most significant bit of the DAC.

11. The SAR-ADC according to claim 1 wherein the TVDU is configured to set the threshold voltage of the comparator based on a mismatch of one bit less than a most significant bit of the DAC.

12. The SAR-ADC according to claim 11, wherein the TVDU is configured to increase or decrease the threshold voltage by an amount based on the mismatch of the lowest bit of the previous step of the DAC.

13. A method comprising setting a threshold voltage of a comparator of a successive approximation register analog-to-digital converter (SAR-ADC) based on an input signal of a digital-to-analog converter (DAC) of the SAR-ADC or an output signal of the comparator, wherein setting the threshold voltage of the comparator comprises setting the threshold voltage of the comparator based on a mismatch of the DAC.

14. The method according to claim 13, wherein setting the threshold voltage comprises determining the threshold voltage iteratively.

15. The method according to claim 13, further comprising setting the threshold voltage of the comparator to:
    zero;
    an offset of the comparator caused by mismatch;
    an amount based on a mismatch of a most significant bit of the DAC;
    an amount based on a mismatch of one bit less than the most significant bit of the DAC or an amount based on a mismatch of a lowest bit of the previous step of the DAC.

16. The method of claim 13, wherein setting the threshold voltage comprises setting the threshold voltage based on a mismatch of a most significant bit of the DAC.

17. The method of claim 13, wherein setting the threshold voltage comprises setting the threshold voltage based on a mismatch of one bit less than a most significant bit of the DAC.

* * * * *